US008181097B2

(12) United States Patent
Bae (10) Patent No.: US 8,181,097 B2
(45) Date of Patent: May 15, 2012

(54) APPARATUS AND METHOD FOR DECODING SIGNAL IN A COMMUNICATION SYSTEM

(75) Inventor: Seul-Ki Bae, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 823 days.

(21) Appl. No.: 12/316,445

(22) Filed: Dec. 12, 2008

(65) Prior Publication Data

US 2009/0158115 A1 Jun. 18, 2009

(30) Foreign Application Priority Data

Dec. 14, 2007 (KR) .................. 10-2007-0131454

(51) Int. Cl.
*H03M 13/00* (2006.01)
*H03M 13/03* (2006.01)
(52) U.S. Cl. .................... 714/790; 714/758; 714/774
(58) Field of Classification Search .................. 714/790, 714/758, 774
See application file for complete search history.

(56) References Cited

U.S. PATENT DOCUMENTS

| 7,734,988 | B2 * | 6/2010 | Kim et al. | 714/774 |
| 7,743,312 | B2 * | 6/2010 | Choi et al. | 714/790 |
| 7,783,961 | B2 * | 8/2010 | Yue et al. | 714/790 |
| 7,934,138 | B2 * | 4/2011 | Kim et al. | 714/751 |
| 8,006,162 | B2 * | 8/2011 | Choi et al. | 714/758 |

* cited by examiner

*Primary Examiner* — Joseph D Torres (57) ABSTRACT

A method and apparatus for decoding a signal in a communication system. The method and apparatus includes receiving a punctured codeword including information bit nodes and unpunctured parity bit nodes; analyzing the unpunctured parity bit nodes, and detecting at least one first block including the unpunctured parity bit nodes among a plurality of blocks each including parity bit nodes having the same importance among all parity bit nodes; and recovering said all parity bit nodes by serial-decoding parity bit nodes included in the first block according to decoding priorities of parity bit nodes, determined by reflecting the first block in a predetermined decoding priority determining algorithm.

10 Claims, 6 Drawing Sheets

APPARATUS AND METHOD FOR DECODING SIGNAL IN A COMMUNICATION SYSTEM

CROSS-REFERENCE TO RELATED APPLICATION(S) AND CLAIM OF PRIORITY

This application claims the benefit under 35 U.S.C. §119(a) of a Korean Patent Application filed in the Korean Intellectual Property Office on Dec. 14, 2007 and assigned Ser. No. 10-2007-0131454, the disclosures of which are incorporated herein by reference.

TECHNICAL FIELD OF THE INVENTION

The present invention relates generally to a communication system and, in particular, to an apparatus and method for decoding signals in a communication system.

BACKGROUND OF THE INVENTION

Communication systems are increasingly developing into packet service communication systems. A packet service communication system refers to a communication system supporting packet services, and is designed to be suitable for high-speed high-capacity data transmission/reception. Particularly, it is known that the next-generation communication system has superior performance gain during high-speed data transmission, and positively considers using Low Density Parity Check (LDPC) codes that can improve the reliability of data transmission by effectively correcting errors caused by noises generated in transmission channels. Meanwhile, in the next-generation data communication system, various schemes have been proposed for high-speed, high-capacity data transmission/reception, such as a Hybrid Automatic Repeat reQuest (HARQ) scheme and an Adaptive Modulation and Coding (AMC) scheme. Various code rates should be supported for the use of the HARQ scheme and the AMC scheme. A puncturing scheme is the typical scheme used for supporting such various code rates. A detailed description of the puncturing scheme will be given below.

A signal transmission apparatus punctures some of the parity bits included in a codeword according to a code rate, and transmits the punctured codeword to a signal reception apparatus. The signal transmission apparatus punctures some of the parity bits included in the codeword using a puncturing pattern, and the puncturing pattern is predefined between the signal transmission apparatus and the signal reception apparatus. For the sake of convenience, a codeword, some of whose parity bits are punctured, will be referred to herein as a 'punctured codeword'.

The signal transmission apparatus generates parity bit nodes using a parity check matrix, generates a punctured codeword by puncturing some of the generated parity bit nodes according to a puncturing pattern, and transmits the generated punctured codeword to the signal reception apparatus.

The parity check matrix includes the first matrix and the second matrix. The first matrix represents an information part (or systematic part), and the second matrix represents a parity part. For a brief description of the present invention, it is assumed herein that the first matrix includes 32 information bit nodes, and the second matrix includes 64 parity bit nodes (k=32, m=64). Further, the second matrix is a dual-diagonal matrix, and it is assumed that a value of dual-diagonal elements is '1' and a value of the remaining elements is '1'.

There are various possible schemes in which a signal reception apparatus receives the punctured codeword and decodes it into an information vector, and a detailed description thereof will be given with reference to FIG. 1.

The signal reception apparatus is assumed to previously recognize the parity check matrix.

Figure 1:
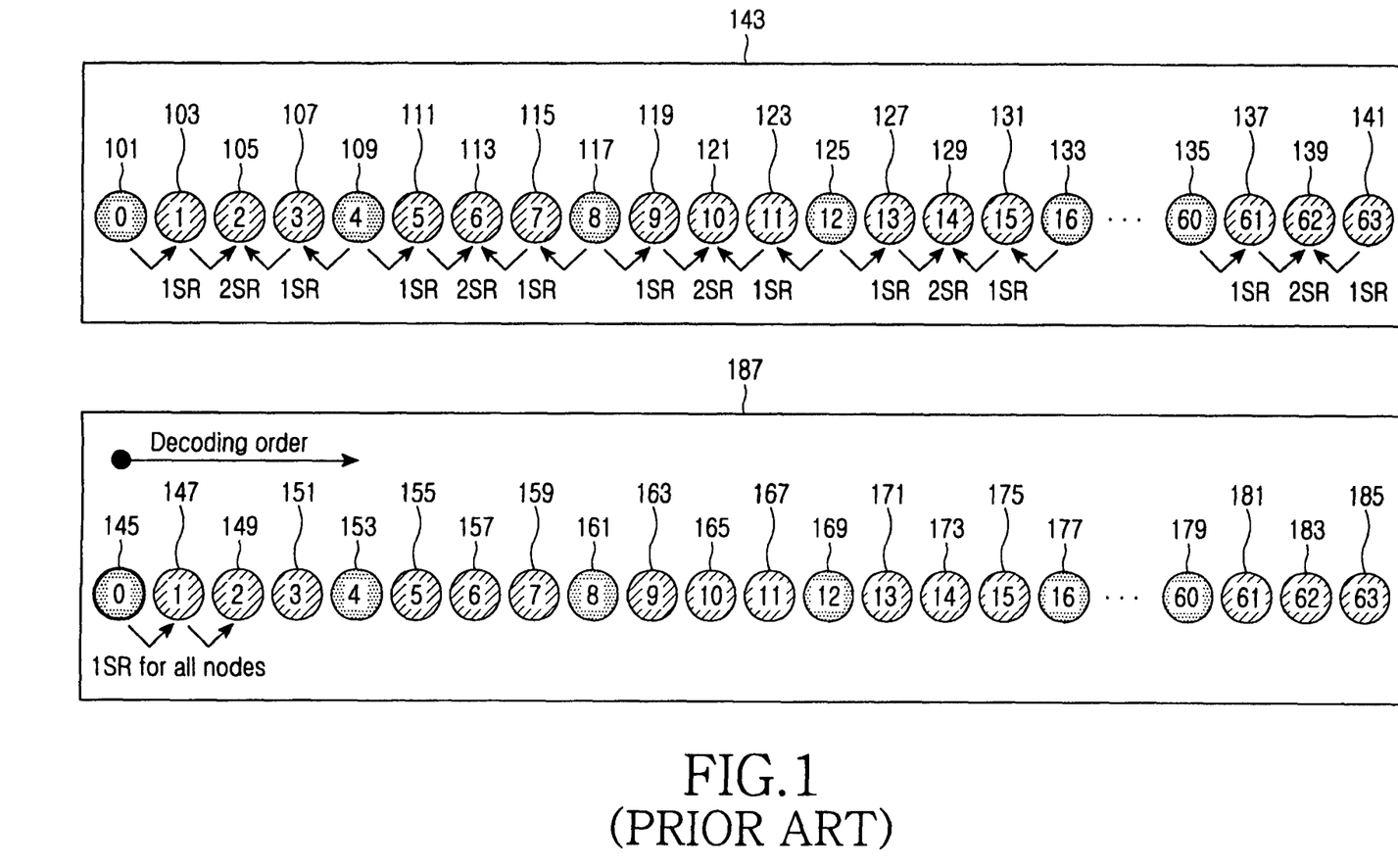
FIG. 1 illustrates a scheduling scheme according to the prior art.

Referring to FIG. 1, a scheduling scheme 143 shows a flooding scheduling scheme, in which 0th, 4th, 8th, 12th, 16th, . . . , 60th parity bit nodes 101, 109, 117, 125, 133, . . . , 135 represent parity bit nodes received from the signal transmission apparatus (i.e., parity nodes unpunctured in the signal transmission apparatus), and 1st to 3rd, 5th to 7th, 9th to 11th, 13th to 15th, . . . , 61st to 63rd parity bit nodes 103, 105, 107, 111, 113, 115, 119, 121, 123, 127, 129, 131, . . . , 137, 139, 141 represent parity bit nodes which are not received from the signal transmission apparatus (i.e., parity nodes punctured in the signal transmission apparatus).

The flooding scheduling scheme refers to a scheme of decoding punctured parity bit nodes by parallel-processing the unpunctured parity bit nodes, and the scheme recovers the punctured parity bit nodes by iteratively performing the decoding processing.

Herein, one iteration means an operation of once performing decoding processing on all parity bit nodes, and p iterations mean an operation of p times performing decoding processing on all parity bit nodes. When the punctured parity bit nodes are recovered after decoding processing is iterated p times (i.e., when meaningful values are filled after p iterations are performed), it is referred to as 'p-Step Recovery (p-SR).

The signal reception apparatus for performing decoding using the flooding scheduling scheme, when it performs the first decoding processing, recovers 1st, 3rd, 5th, 7th, 9th, 11th, 13th, 15th, . . . , 61st, 63rd neighboring parity bit nodes 103, 107, 111, 115, 119, 123, 127, 131, . . . , 137, 141 using 0th, 4th, 8th, 12th, 16th, . . . , 60th parity bit nodes 101, 109, 117, 125, 133, . . . , 135. Therefore, the 1st, 3rd, 5th, 7th, 9th, 11th, 13th, 15th, . . . , 61st, 63rd parity bit nodes 103, 107, 111, 115, 119, 123, 127, 131, . . . , 137, 141 become 1-SR parity bit nodes.

The signal reception apparatus, when it performs the second decoding processing, recovers 2nd, 6th, 10th, 14th, . . . , 62nd neighboring parity bit nodes 105, 113, 121, 129, . . . , 139 using the recovered 1st, 3rd, 5th, 7th, 9th, 11th, 13th, 15th, . . . , 61st, 63rd parity bit nodes 103, 107, 111, 115, 119, 123, 127, 131, . . . , 137, 141. Therefore, the 2nd, 6th, 10th, 14th, . . . , 62nd parity bit nodes 105, 113, 121, 129, . . . , 139 become 2-SR parity bit nodes using the flooding scheduling scheme. In this way, when 2-SR is achieved, the signal reception apparatus recovers all parity bit nodes.

Referring to FIG. 1, a scheduling scheme 187 shows a variable node-based serial scheduling scheme, in which 0th, 4th, 8th, 12th, 16th, . . . , 60th parity bit nodes 145, 153, 161, 169, 177, . . . , 179 represent parity bit nodes received from the signal transmission apparatus, and 1st to 3rd, 5th to 7th, 9th to 11th, 13th to 15th, . . . , 61st to 63rd parity bit nodes 147, 149, 151, 155, 157, 159, 163, 165, 167, 171, 173, 175, . . . , 181, 183, 185 represent the parity bit nodes which are not received from the signal transmission apparatus.

The variable node-based serial scheduling scheme refers to a scheme of decoding punctured parity bit nodes by serial-processing the unpunctured parity bit nodes, and the scheme recovers all punctured parity bit nodes by once performing the decoding processing.

In the case where the signal reception apparatus for performing decoding using the variable node-based serial scheduling scheme sequentially decodes the parity bit nodes, since a value of the recovered parity bit node is delivered to the immediately neighboring parity bit node, the signal reception apparatus recovers all parity bit nodes with one decoding processing. That is, the signal reception apparatus recovers the 1st parity bit node 147 using the 0th parity bit node 145, recovers the 2nd parity bit node 149 using the recovered 1st parity bit node 147, and recovers the 3rd parity bit node 151 using the recovered 2nd parity bit node 149. In this manner, the signal reception apparatus recovers the 1st parity bit node 147 through the 63rd parity bit node 185 using the variable node-based serial scheduling scheme, with one decoding processing.

However, regarding the flooding scheduling scheme, since decoding processing is iterated several times when it recovers punctured parity bit nodes, its decoding convergence speed may require a predetermined time.

In addition, as to the variable node-based serial scheduling scheme, when it recovers punctured parity bit nodes, the punctured parity bit nodes may receive meaningless values as a distance between unpunctured parity bit nodes and punctured parity bit nodes is longer, causing a decrease in decoding efficiency.

SUMMARY OF THE INVENTION

To address the above-discussed deficiencies of the prior art, it is a primary object of the present invention to address at least the problems and/or disadvantages and to provide at least the advantages described below. Accordingly, an aspect of the present invention is to provide a new scheduling scheme for improving a decoding convergence speed of a signal reception apparatus and maintaining a decoding effect at a predetermined level or higher in a communication system.

According to one aspect of the present invention, there is provided a method for decoding a signal in a communication system. The method includes receiving a punctured codeword including information bit nodes and unpunctured parity bit nodes; analyzing the unpunctured parity bit nodes; detecting at least one first block including the unpunctured parity bit nodes among a plurality of blocks each including parity bit nodes having the same importance among all parity bit nodes; and recovering said all parity bit nodes by serial-decoding parity bit nodes included in the first block according to decoding priorities of parity bit nodes, determined by reflecting the first block in a predetermined decoding priority determining algorithm. The decoding priorities are determined so as to preferentially decode parity bit nodes included in the first block, and sequentially decode parity bit nodes in order of parity bit nodes included in a block having a lower importance to parity bit nodes included in a block having a higher importance.

According to another aspect of the present invention, there is provided an apparatus for decoding a signal in a communication system. The apparatus includes a receiver for receiving a punctured codeword including information bit nodes and unpunctured parity bit nodes; and a decoder for analyzing the unpunctured parity bit nodes, detecting at least one first block including the unpunctured parity bit nodes among a plurality of blocks each including parity bit nodes having the same importance among all parity bit nodes, and recovering said all parity bit nodes by serial-decoding parity bit nodes included in the first block according to decoding priorities of parity bit nodes, determined by reflecting the first block in a predetermined decoding priority determining algorithm. The decoding priorities are determined so as to preferentially decode parity bit nodes included in the first block, and sequentially decode parity bit nodes in order of parity bit nodes included in a block having a lower importance to parity bit nodes included in a block having a higher importance.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

Preferred embodiments of the present invention will now be described in detail with reference to the annexed drawings. In the following description, a detailed description of known functions and configurations incorporated herein has been omitted for clarity and conciseness.

According to the present invention, a signal transmission apparatus classifies all parity bit nodes into a plurality of kernel blocks, determines a code rate according to a channel state, punctures at least one of the plurality of kernel blocks according to the determined code rate, generates an LDPC code including at least one kernel block that has not undergone the puncturing, and transmits the generated LDPC code. A signal reception apparatus provides a scheme of receiving the LDPC code; detecting at least one kernel block that has not undergone the puncturing, by analyzing the received LDPC code; determining decoding priority of the parity bit node by reflecting the detected kernel block in a predetermined decoding priority determining algorithm; and serial-decoding the detected kernel block according to the decoding priority. Regarding the decoding priority, the signal reception apparatus preferentially decodes the unpunctured bit nodes, and sequentially decodes the punctured parity bit nodes in ascending order of the priority.

The term 'serial decoding' as used herein refers to an operation of performing decoding using the variable node-based serial scheduling scheme. Also, the term 'variable node-based serial scheduling scheme' as used herein refers to a scheme of arranging unpunctured parity bit nodes and punctured parity bit nodes according to the decoding priority, and serial-decoding the parity bit nodes in their arranged order.

Further, the proposed signal reception apparatus performs a partial parallel decoding operation of simultaneously decoding parity bit nodes having the same decoding priority.

Although the signal transmission apparatus according to the present invention can generate and transmit an LDPC code according to various puncturing patterns, it is preferable that the signal transmission apparatus can generate and transmit a block LDPC code according to the puncturing pattern disclosed in Korean Patent Application No. KR-2006-0011685.

Figure 2:
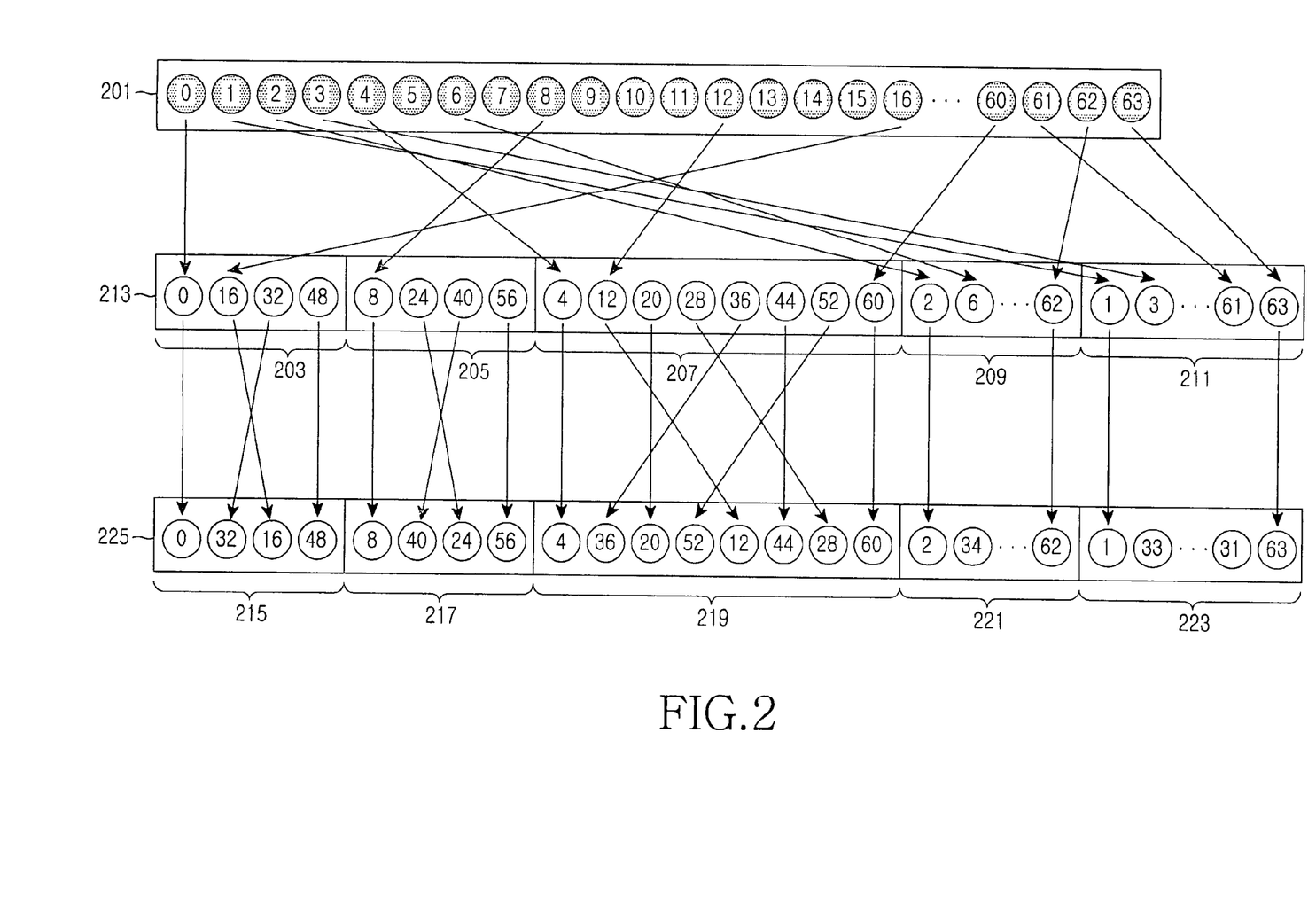
FIG. 2 is a diagram illustrating a process in which a puncturer classifies unpunctured parity bit nodes into kernel blocks according to an embodiment of the present invention.

FIG. 2 is a diagram illustrating a method in which a signal transmission apparatus punctures a plurality of parity bit nodes among all parity bit nodes according to importance of transmission information bit nodes according to an embodiment of the present invention. With reference to FIG. 2, a description will now be made of a process in which a signal transmission apparatus punctures and transmits parity bit nodes according to importance of information bit nodes.

When a parity check matrix H is a dual-diagonal matrix, the signal transmission apparatus can determine a code rate according to a channel state, and puncture bit nodes of an LDPC code according to the determined code rate, using Equation 1:

1st kernel blocks: $\Psi_1 = \{P_{16n}\} B_1(n) = 16n \; n = 0,1,2,3$

2nd kernel blocks: $\Psi_2 = \{P_{16n+8}\} B_2(n) = 16n+8 \; n = 0,1,2,3$

3rd kernel blocks: $\Psi_3 = \{P_{8n+4}\} B_3(n) = 8n+4 \; n = 0,1,2,3,\ldots,7,$ [Eqn. 1]

4th kernel blocks: $\Psi_4 = \{P_{4n+2}\} B_4(n) = 4n+2 \; n = 0,1,2,3,\ldots,15$ 5th kernel blocks: $\Psi_5 = \{P_{2n+1}\} B_5(n) = 2n+1 \; n = 0,1,2,3,\ldots,31$ where $\psi_i$ denotes an $i^{th}$ kernel block for $1 \leq i \leq 5$, and Bi denotes a parity bit node punctured in an $i^{th}$ kernel block for $1 \leq i \leq 5$.

Equation 1 represents kernel blocks which are classified according to importance of parity bit nodes, and the importance of the kernel blocks are determined in the order of 1st, 2nd, 3rd, 4th, and 5th kernel blocks.

That is, the signal transmission apparatus determines kernel blocks to be subjected to puncturing in ascending order of the importance taking into account the determined code rate and the importance of the kernel blocks, and punctures parity bit nodes included in the determined kernel blocks.

Referring to FIG. 2, for a code rate=⅓, a parity bit node set 201 represents parity bit nodes that a puncturer of the signal transmission apparatus outputs, and a parity bit node set 213 represents kernel blocks that the puncturer of the signal transmission apparatus arranges according to kernel block priorities. More specifically, the puncturer of the signal transmission apparatus, referring to the kernel block priorities of Equation 1, generates the 1st kernel block 203 including 0th, 16th, 32nd, and 48th parity bit nodes; generates the 2nd kernel block 205 including 8th, 24th, 40th, and 56th parity bit nodes; generates the 3rd kernel block 207 including 4th, 12th, 20th, 28th, 36th, 44th, 52nd, and 60th parity bit nodes; generates the 4th kernel block 209 including 2nd, 6th, . . . , 62nd parity bit nodes; and generates the 5th kernel block 211 including 1st, 3rd, . . . , 61st, and 63rd parity bit nodes. Further, the puncturer of the signal transmission apparatus generates the parity bit node set 213 by arranging the 1st kernel block 203 through the 5th kernel block 211 in order of the kernel block priorities.

A parity bit node set 225 represents an operation in which the puncturer of the signal transmission apparatus shuffles parity bit nodes included in each kernel block according to a predetermined order. More specifically, the puncturer of the signal transmission apparatus generates the final 1st kernel block 215 in which 0th, 32nd, 16th, and 48th parity bit nodes are arranged in order by reflecting a predetermined parity bit node arrangement order in the 1st kernel block 203 in which 0th, 16th, 32nd, and 48th parity bit nodes are arranged in order. The puncturer of the signal transmission apparatus generates the final 2nd kernel block 217 in which 8th, 40th, 24th, and 56th parity bit nodes are arranged in order by reflecting a predetermined parity bit node arrangement order in the 2nd kernel block 205 in which 8th, 24th, 40th and 56th parity bit nodes are arranged in order. The puncturer of the signal transmission apparatus generates the final 3rd kernel block 219 in which 4th, 36th, 20th, 52nd, 12th, 44th, 28th and 60th parity bit nodes are arranged in order by reflecting a predetermined parity bit node arrangement order in the 3rd kernel block 207 in which 4th, 12th, 20th, 28th, 36th, 44th, 52nd and 60th parity bit nodes are arranged in order.

In this manner, the puncturer of the signal transmission apparatus generates the final 4th kernel block 221 by changing the arrangement order of the parity bit nodes included in the 4th kernel block 209 according to a predetermined order, and generates the final 5th kernel block 223 by changing the arrangement order of the parity bit nodes included in the 5th kernel block 211 according to a predetermined order.

The signal transmission apparatus transmits the final 1st kernel block 215 through the final 5th kernel block 223 to the signal reception apparatus.

With reference to FIG. 2, a description has been made so far to a process with a code rate=⅓. The puncturer of the signal transmission apparatus arranges kernel blocks according to kernel block priorities and shuffles parity bit nodes included in the arranged kernel blocks. However, the puncturer of the signal transmission apparatus can perform the above process even for a code rate≠⅓.

For example, for a code rate=½, the puncturer of the signal transmission apparatus can puncture parity bit nodes included in the 5th kernel block $\psi_5$ among all parity bit nodes and arrange the 1st kernel block 203 through the 4th kernel block 209 in order. Further, the signal transmission apparatus can shuffle parity bit nodes included in the arranged 1st kernel block 203 through 4th kernel block 209 according to a predetermined order and then transmit the results to the signal reception apparatus.

Figure 3A:
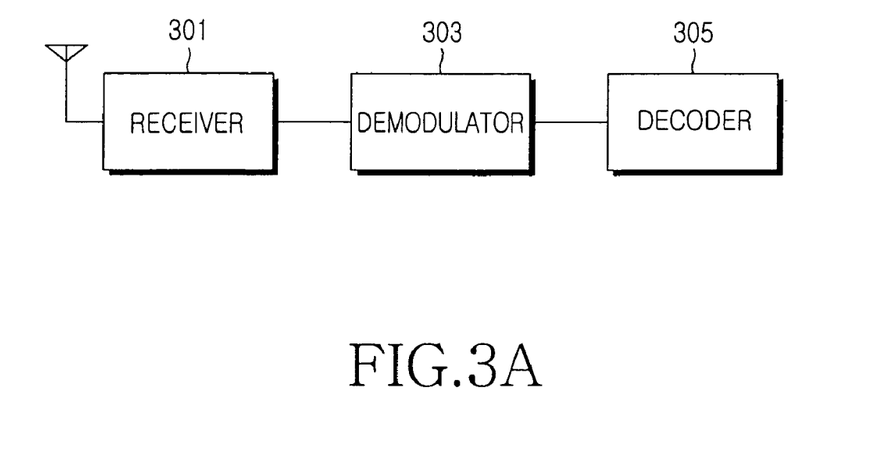
FIG. 3A is a block diagram illustrating a structure of a signal reception apparatus according to an embodiment of the present invention.

FIG. 3A is a block diagram illustrating a structure of a signal reception apparatus according to an embodiment of the present invention. With reference to FIG. 3A, a description will now be made of elements of a signal reception apparatus.

Referring to FIG. 3A, the signal reception apparatus includes a receiver 301, a demodulator 303, and a decoder 305.

In operation, the receiver 301 receives a signal transmitted by a signal transmission apparatus, generates a signal-processed received signal by signal-processing the received signal, and outputs the signal-processed received signal to the demodulator 303. The demodulator 303 generates a demodulated received signal by demodulating the signal-processed received signal provided from the receiver 301 using a predetermined demodulation scheme, and outputs the demodulated received signal to the decoder 305. The decoder 305 generates the original data by decoding the demodulated received signal using a predetermined decoding scheme and outputs the generated original data.

Figure 3B:
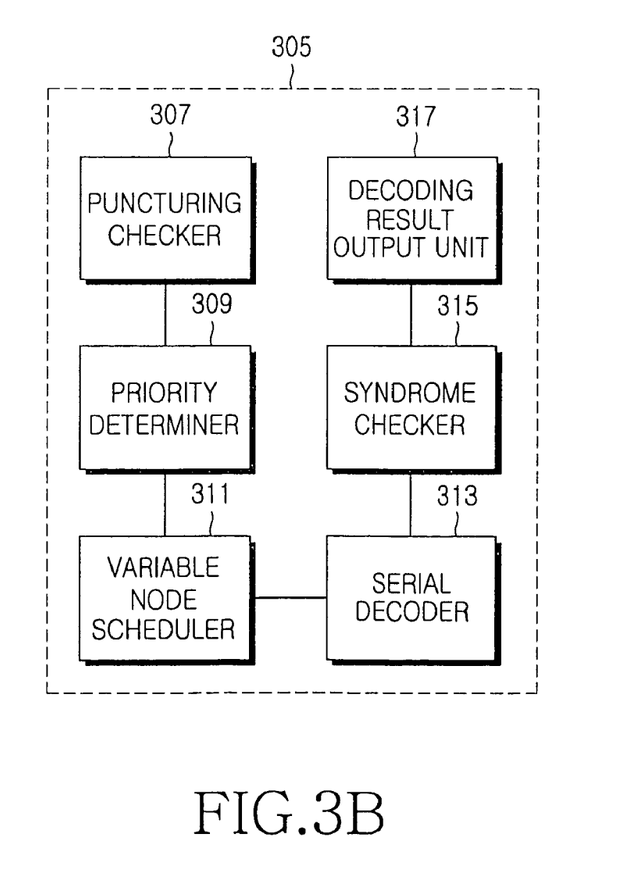
FIG. 3B is a block diagram illustrating a structure of a decoder according to an embodiment of the present invention.

FIG. 3B is a block diagram illustrating a structure of the decoder 305 according to an embodiment of the present invention. With reference to FIGS. 3A and 3B, a description will now be made of elements of the decoder 305.

In FIG. 3B, the decoder 305 includes a puncturing checker 307, a priority determiner 309, a variable node scheduler 311, a serial decoder 313, a syndrome checker 315, and a decoding result output unit 317.

In operation, the puncturing checker 307 analyzes a punctured codeword n', or LDPC code, included in the received signal, and checks unpunctured bit nodes n' and punctured bit nodes n-n' among all bit nodes n. Here, the puncturing checker 307 calculates Log Likelihood Ratios (LLRs) corresponding to their associated unpunctured bit nodes, and sets LLRs corresponding to their associated punctured bit nodes to '0'. Further, the puncturing checker 307 generates information on the punctured/unpunctured state of parity bit nodes among all the bit nodes, and outputs the information on the punctured/unpunctured state of parity bit nodes to the priority determiner 309.

The priority determiner 309 determines a parity bit node's decoding priority indicating its order when the decoder 305 decodes parity bit nodes using the information on the punctured/unpunctured state of parity bit nodes.

The parity bit nodes are classified into i kernel blocks $\psi_1$ to $\psi_i$ according to puncturing priorities of the parity bit nodes, and it is assumed that of the parity bit nodes, parity bit nodes included in the 1st kernel block $\psi_1$ through the $j^{th}$ kernel block $\psi_j$ are transmitted without undergoing puncturing, and parity bit nodes included in the $(j+1)^{th}$ kernel block $\psi_{j+1}$ through the $i^{th}$ kernel block $\psi_i$ are not transmitted as they are punctured. Herein, i denotes an integer indicating the maximum possible number of transmission kernel blocks, and j denotes an integer indicating the number of transmitted kernel blocks.

Therefore, since the transmitted parity bit nodes are parity bit nodes included in the 1st kernel block $\psi_1$ through the $j^{th}$ kernel block $\psi_j$, their decoding priorities are set such that the parity bit nodes included in $\Psi_1 \cup \Psi_2 \cup \ldots \cup \Psi_j$ have the highest priorities, and thereafter, they are set in order of $\psi_i$, $\psi_{i-1}, \psi_{i-2}, \ldots, \psi_{j+2}, \psi_{j+1}$.

The decoding priorities described up to now can be mathematically summarized as follows:

$$\Omega_1 = \Psi_1 \cup \Psi_2 \cup \ldots \cup \Psi_j$$

$$\Omega_2 = \Psi_i$$

$$\Omega_3 = \Psi_{i-1}$$ [Eqn. 2]

$$\Omega_{i-j+1} = \Psi_{j+1}$$

where $\Omega_{i-j+1}$ denotes a decoding priority group of parity bit nodes, j denotes the number of at least one kernel block included in the LDPC code (where a range of j is $1 \leq j < i$), i denotes the number of kernel blocks obtained by classifying all the parity bit nodes (where i is an arbitrary integer), and $\psi_i$ and $\psi_j$ denote kernel blocks.

The decoding priorities of the parity bit nodes are determined such that after decoding the received parity bit nodes, the decoder 305 decodes parity bit nodes in order of the parity bit nodes included in kernel block having a lower importance to the parity bit nodes included in the kernel block having a higher importance.

Upon receiving the information on the punctured/unpunctured state of parity bit nodes, the priority determiner 309 can detect unpunctured parity bit nodes, detect the transmitted kernel blocks using the detected unpunctured parity bit nodes, and determine i and j using the transmitted kernel blocks.

The variable node scheduler 311 arranges the received parity bit nodes according to the decoding priorities, and outputs the arranged parity bit nodes to the serial decoder 313. When arranging parity bit nodes included in the same decoding priority group, the variable node scheduler 311 can randomly arrange the parity bit nodes regardless of order.

The serial decoder 313 performs decoding on the basis of variable nodes, and it first decodes information bit nodes and then decodes parity bit nodes. The serial decoder 313 receives the arranged parity bit nodes from the variable node scheduler 311 according to decoding priorities of the parity bit nodes, serial-decodes the arranged parity bit nodes, and outputs the decoded parity bit nodes and the decoded information bit nodes to the syndrome checker 315. When decoding parity bit nodes included in the same decoding priority group, the serial decoder 313 can partially parallel-decode the parity bit nodes.

The syndrome checker 315 checks whether it will continuously perform or stop decoding processing. More specifically, the syndrome checker 315 receives the decoded parity bit nodes and the decoded information bit nodes from the serial decoder 313, and calculates syndrome values of the decoded parity bit nodes. Further, the syndrome checker 315 checks if the calculated syndrome values are all '0', or not all '0'. If the calculated syndrome values are all '0', the syndrome checker 315 stops the decoding processing and outputs the decoded information bit nodes and the decoded parity bit nodes to the decoding result output unit 317, determining that no error has occurred in the received codeword.

Otherwise, if the calculated syndrome values are not all '0', the syndrome checker 315 outputs the decoded parity bit nodes and the decoded information bit nodes to the serial decoder 313, and iterates the decoding processing.

The decoding result output unit 317 receives the decoded parity bit nodes and the decoded information bit nodes from the syndrome checker 315, searches for the decoded information bit nodes, and outputs the searched information bit nodes.

Figure 4:
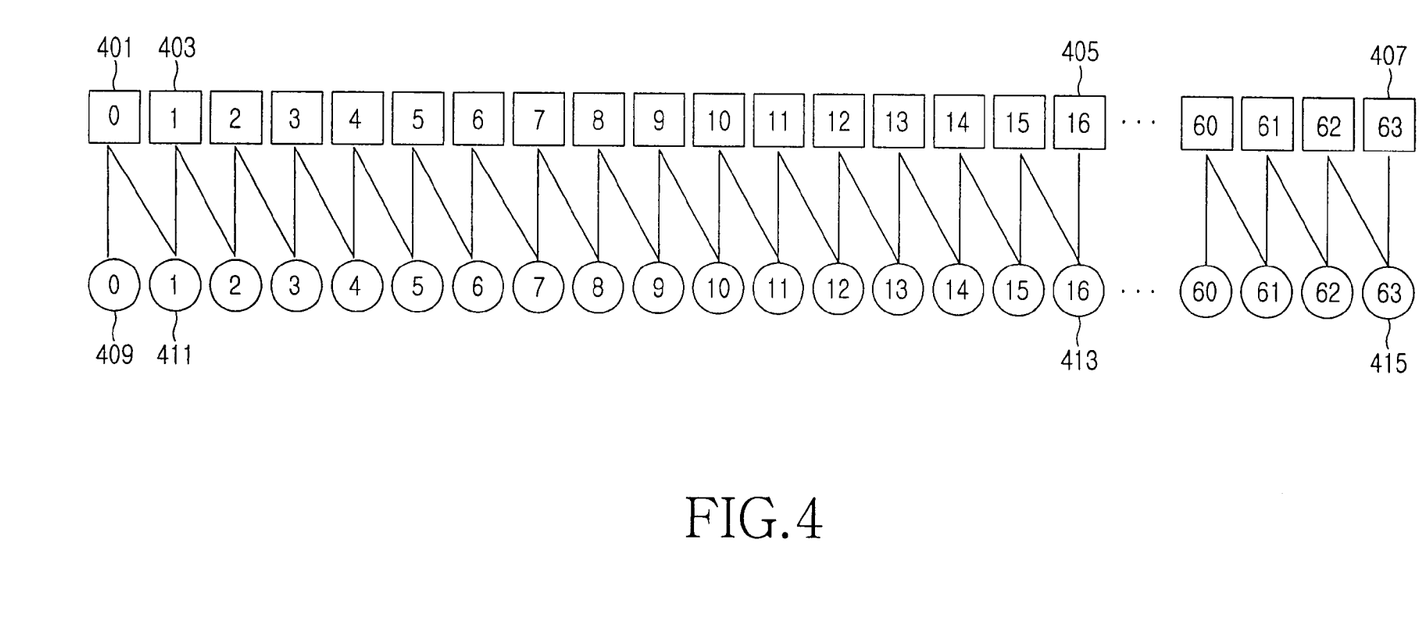
FIG. 4 is a diagram illustrating a parity check matrix with a factor graph according to an embodiment of the present invention.

FIG. 4 is a diagram illustrating a parity check matrix with a factor graph according to an embodiment of the present invention. With reference to FIG. 4, a description will now be made of a factor graph of a parity check matrix.

For a brief description of the present invention, it is assumed in FIG. 4 that the number of parity bit nodes is 64, and the parity check matrix is a dual-diagonal matrix.

As shown in FIG. 4, if the parity check matrix is shown with a factor graph, 64 variable nodes 409, 411, 413, ..., 415 are zigzag connected to 64 check nodes 401, 403, 405, ..., 407.

Figure 5:
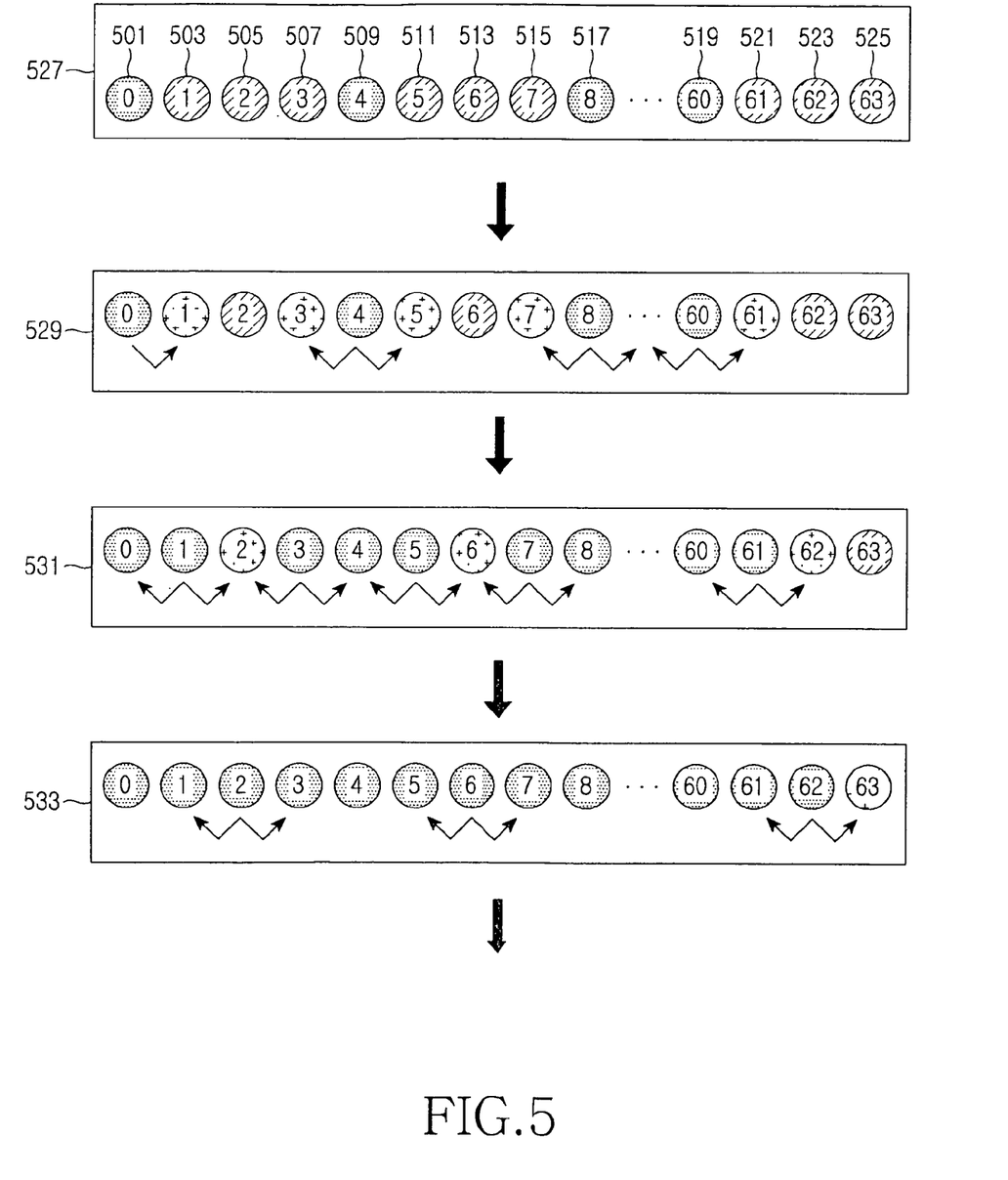
FIG. 5 is a diagram illustrating a process in which a decoder performs serial decoding according to an embodiment of the present invention.

FIG. 5 is a diagram illustrating a process in which the decoder 305 performs serial decoding according to an embodiment of the present invention. With reference to FIG.

5, a description will now be made of a process in which the decoder 305 performs serial decoding.

For a brief description of the present invention, it is assumed that using Equation 1, the signal transmission apparatus transmits parity bit nodes included in the 1st, 2nd and 3rd kernel blocks, and punctures (i.e., does not transmit), parity bit nodes included in the 4th and 5th kernel blocks.

The decoder 305 of the signal reception apparatus receives a demodulated parity bit node set 527, and checks punctured parity bit nodes and unpunctured parity bit nodes using the received parity bit node set 527

The parity bit node set 527 is a set of unpunctured parity bits included in the 1st, 2nd and 3rd kernel blocks and punctured parity bits included in the 4th and 5th kernel blocks. That is, the parity bit node set 527 includes the unpunctured 0th, 4th, 8th, . . . , 60th parity bit nodes 501, 509, 517, . . . , 519, and the punctured 1st, 2nd, 3rd, 5th, 6th, 7th, . . . , 61st, 62nd and 63rd parity bit nodes 503, 505, 507, 511, 513, 515, . . . , 521, 523, 525.

The decoder 305 determines that i=5 and j=3, according to the checked punctured/unpunctured state of parity bit nodes in the parity bit node set 527, and determines decoding priorities of the parity bit nodes using the determined values of i and j.

The determined decoding priorities are defined as:

$$\Omega_1 = \Psi_1 \cup \Psi_2 \cup \Psi_3$$

$$\Omega_2 = \Psi_5 \quad \text{[Eqn. 3]}$$

$$\Omega_3 = \Psi_4$$

where $\Omega_1$, $\Omega_2$ and $\Omega_3$ denote decoding priority groups of parity bit nodes, i and j are arbitrary integers, i=5, j=3, and $\psi_i$ denotes a kernel block.

Therefore, the determined decoding priorities of the parity bit nodes refer to decoding parity bit nodes in order of $\Omega_1$, $\Omega_2$ and $\Omega_3$.

The decoder 305 determines the decoding priorities of Equation 3, and then serial-decodes the parity bit node set 527 according to the determined decoding priorities.

The term 'serial decoding' as used herein refers to an operation of recovering punctured parity bit nodes by performing one decoding processing. More specifically, the decoder 305 recovers the 1st, 3rd, 5th, 7th, . . . , 61st parity bit nodes in a parity bit node set 529 by serial-decoding unpunctured parity bit nodes 501, 509, 517, 519 ($\Omega_1 = \Psi_1 \cup \Psi_2 \cup \Psi_3$) included in the parity bit node set 527.

Herein, when a punctured parity bit node recovers a pth arbitrary parity bit node within one decoding processing, it is referred to as a p-Mini Step Recovery (p-MSR), where p is an arbitrary integer. Therefore, the decoder 305 can recover the 1st, 3rd, 5th, 7th, 61st parity bit nodes by performing 1-MSR.

Further, the decoder 305 can recover 2nd, 6th, . . . , 62nd parity bit nodes in a parity bit node set 531 by serial-decoding the 1st, 3rd, 5th, 7th, . . . , 61st parity bit nodes ($\Omega_2 = \Psi_5$) recovered in the 1-MSR. Therefore, the decoder 305 can recover 2nd, 6th, . . . , 62nd parity bit nodes by performing 2-MSR. In addition, the decoder 305 can recover the 63rd parity bit node by serial-decoding the 2nd, 6th, . . . , 62nd parity bit nodes ($\Omega_3 = \Psi_4$) recovered in the 2-MSR. Therefore, the decoder 305 can recover the 63rd parity bit nodes by performing 3-MSR.

As a result, the decoder 305 can recover punctured parity bit nodes by performing 3-MSR during one decoding processing.

When performing serial decoding, the decoder 305 can serial-decode parity bit nodes included in a set of the parity bit nodes having the same priority regardless of order. For example, the decoder 305 can serial-decode the $0^{th}$, $4^{th}$, $8^{th}$, . . . , $60^{th}$ parity bit nodes 501, 509, 517, . . . , 519 having the decoding priority in order of the $8^{th}$, $60^{th}$, $0^{th}$, . . . , $4^{th}$ parity bit nodes, or serial-decode the $60^{th}$, $4^{th}$, $8^{th}$, . . . , $0^{th}$ parity bit nodes in regular order.

Alternatively, the decoder 305, when performing serial decoding, can partially parallel-decode parity bit nodes included in a set of the parity bit nodes having the same priority. For example, the decoder 305 can simultaneously parallel-decode the $0^{th}$, $4^{th}$, $8^{th}$, . . . , $60^{th}$ parity bit nodes 501, 509, 517, . . . , 519 having the same decoding priority.

Figure 6:
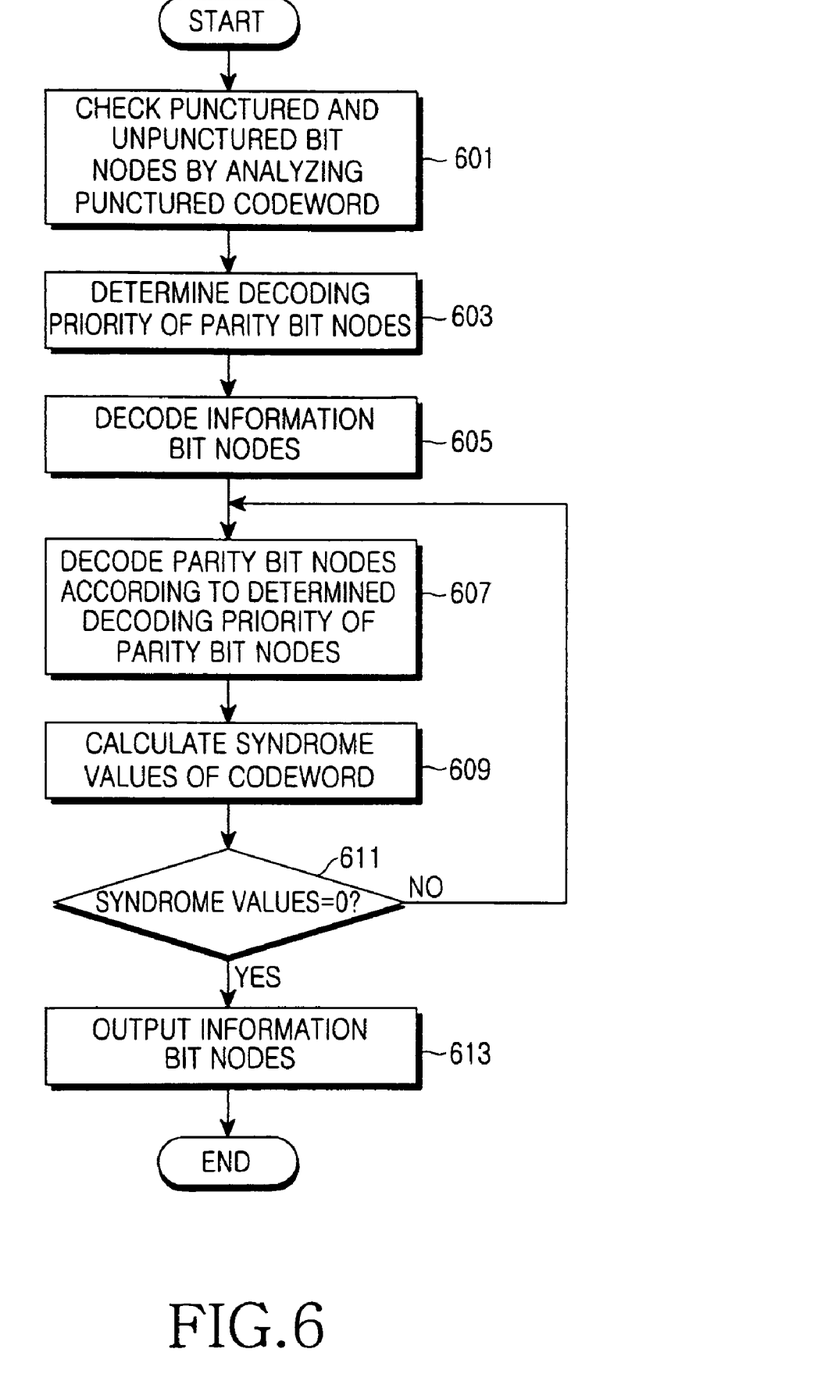
FIG. 6 is a flowchart illustrating a process in which a decoder serial-decodes parity bit nodes according to an embodiment of the present invention.

FIG. 6 is a flowchart illustrating a process in which the decoder 305 in the signal reception apparatus serial-decodes parity bit nodes according to an embodiment of the present invention. With reference to FIG. 6, a description will now be made of a process in which the decoder 305 decodes parity bit nodes.

It is assumed that all parity bit nodes are classified into i kernel blocks $\psi_1$ to $\psi_i$ according to puncturing priorities of the parity bit nodes. Further, it is assumed that the signal transmission apparatus determines a code rate according to a channel state, determines at least one kernel block $\psi_{j+1}$ to $\psi_i$ to be subjected to puncturing among the classified kernel blocks according to the determined code rate, punctures parity bit nodes included in the determined kernel block among all the parity bit nodes, classifies unpunctured parity bit nodes into kernel blocks $\psi_1$ to $\psi_j$, generates a punctured codeword including the classified kernel blocks and unpunctured information bit nodes, and transmits the generated codeword to a signal reception apparatus.

In step 601, the decoder 305 in the signal reception apparatus receives the punctured codeword, checks punctured bit nodes and unpunctured bit nodes by analyzing the punctured codeword, and generates parity bit node's puncturing information indicating the punctured/unpunctured state of the checked parity bit nodes. Herein, the bit nodes include information bit nodes and parity bit nodes.

In step 603, the decoder 305 detects the kernel blocks $\psi_1$ to $\psi_j$ that the signal reception apparatus received, using the generated parity bit node's puncturing information, and determines decoding priorities of the parity bit nodes by reflecting the received kernel blocks in a predetermined decoding priority determining algorithm for parity bit nodes. Herein, the decoding priority determining algorithm can determine decoding priorities of parity bit nodes using the received kernel blocks and Equation 2.

In step 605, the decoder 305 decodes the information bit nodes. In step 607, the decoder 305 arranges the unpunctured parity bit nodes and the punctured parity bit nodes according to the determined decoding priorities, serial-decodes the arranged parity bit nodes in regular order, and then proceeds to step 609.

The decoding priorities are determined such that after decoding the received parity bit nodes, the decoder 305 decodes parity bit nodes in order of the parity bit nodes included in the kernel block having a lower importance to the parity bit nodes included in the kernel block having a higher importance.

When arranging parity bit nodes having the same decoding priority, the decoder 305 can randomly arrange the parity bit nodes regardless of order. Further, when decoding parity bit nodes having the same decoding priority, the decoder 305 can perform a partial parallel decoding operation of simultaneously decoding parity bit nodes having the same decoding priority.

In step 609, the decoder 305 checks for error in a decoded codeword including the decoded information bit nodes and the decoded parity bit nodes to determine if there is any error in an arbitrary parity bit node, and then proceeds to step 611. Here, the decoder 305 can determine if there is any error in an arbitrary parity bit node by calculating syndrome values of the decoded codeword.

In step 611, if the calculated syndrome values are all '0', the decoder 305 proceeds to step 613, and if the calculated syndrome values are not all '0' (i.e., if a particular syndrome value among the calculated syndrome values is a value other than '0'), the decoder 305 proceeds to step 607 where it iterates serial decoding.

In step 613, the decoder 305 searches the decoded codeword for the decoded information bit nodes, and outputs the searched information bit nodes to the exterior.

The proposed method of decoding the punctured LDPC code in the communication system can improve a decoding convergence speed and maintain the decoding effect at a predetermined level or higher.

As is apparent from the foregoing description, in the communication system according to the present invention, the signal reception apparatus decodes signals using the proposed variable node-based serial scheduling scheme that changes the decoding order of the normal variable node-based serial scheduling scheme, thereby improving a decoding convergence speed.

Further, the communication system according to the present invention decodes signals using the proposed variable node-based serial scheduling scheme, making it possible to maintain the decoding effect at a predetermined level or higher.

While the invention has been shown and described with reference to a certain preferred embodiment thereof, it will be understood by those skilled in the art that various changes in form and details may be made therein without departing from the spirit and scope of the invention as defined by the appended claims. For example, although the total number of parity bit nodes is assumed herein to be 64, it is not intended to limit the scope of the present invention to the total number of parity bit nodes. Further, although a plurality of variable nodes are herein zigzag connected to a plurality of check nodes on the factor graph of the parity check matrix, the present invention can be applied to a parity check matrix in which a plurality of variable nodes are zigzag connected to a plurality of check nodes and the 0th check node is connected to the 16th and 63rd variable nodes. In addition, while the present invention has been described using the normal LDPC code, the block LDPC code can also be applied to the present invention.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for decoding a signal in a communication system, the method comprising:
   receiving a punctured codeword including information bit nodes and unpunctured parity bit nodes;
   analyzing the unpunctured parity bit nodes, and detecting at least one first block including the unpunctured parity bit nodes among a plurality of blocks each including parity bit nodes having a same importance among all parity bit nodes; and
   recovering said all said parity bit nodes by serial-decoding parity bit nodes included in the first block according to decoding priorities of parity bit nodes, determined by reflecting the first block in a predetermined decoding priority determining algorithm;
   wherein the decoding priorities are determined so as to preferentially decode parity bit nodes included in the first block, and sequentially decode parity bit nodes in order of parity bit nodes included in a block having a lower importance to parity bit nodes included in a block having a higher importance.

2. The method of claim 1, wherein recovering all the parity bit nodes comprises:
   inserting a zero (0) into each of punctured parity bit nodes except for the first block among the plurality of blocks; and
   arranging the parity bit nodes in the first block and the 0-inserted parity bit nodes according to the decoding priorities.

3. The method of claim 1, wherein recovering all the parity bit nodes comprises:
   recovering punctured parity bit nodes included in a second block having the lowest importance by decoding parity bit nodes included in the first block; and
   recovering punctured parity bit nodes included in a third block having importance higher than that of the second block by decoding the recovered parity bit nodes.

4. The method of claim 1, wherein recovering all the parity bit nodes comprises:
   decoding parity bit nodes having the same decoding priority regardless of order.

5. The method of claim 1, wherein recovering all the parity bit nodes comprises:
   performing a partial parallel decoding operation of simultaneously decoding parity bit nodes having the same decoding priority.

6. An apparatus for decoding a signal in a communication system, the apparatus comprising:
   a receiver for receiving a punctured codeword including information bit nodes and unpunctured parity bit nodes; and
   a decoder for analyzing the unpunctured parity bit nodes, detecting at least one first block including the unpunctured parity bit nodes among a plurality of blocks each including parity bit nodes having a same importance among all parity bit nodes, and recovering said all parity bit nodes by serial-decoding parity bit nodes included in the first block according to decoding priorities of parity bit nodes, determined by reflecting the first block in a predetermined decoding priority determining algorithm;
   wherein the decoding priorities are determined so as to preferentially decode parity bit nodes included in the first block, and sequentially decode parity bit nodes in order of parity bit nodes included in a block having a lower importance to parity bit nodes included in a block having a higher importance.

7. The apparatus of claim 6, wherein the decoder inserts a zero (0) into each of punctured parity bit nodes except for the first block among the plurality of blocks, and arranges the parity bit nodes in the first block and the 0-inserted parity bit nodes according to the decoding priorities.

8. The apparatus of claim 6, wherein the decoder recovers punctured parity bit nodes included in a second block having the lowest importance by decoding parity bit nodes included in the first block, and recovers punctured parity bit nodes included in a third block having importance higher than that of the second block by decoding the recovered parity bit nodes.

9. The apparatus of claim 6, wherein the decoder decodes parity bit nodes having the same decoding priority regardless of order of all the parity bit nodes.

10. The apparatus of claim 6, wherein the decoder simultaneously decodes parity bit nodes having the same decoding priority.

* * * * *